US006953605B2

(12) United States Patent
Sion et al.

(10) Patent No.: US 6,953,605 B2
(45) Date of Patent: Oct. 11, 2005

(54) METHOD FOR DENSIFYING POROUS SUBSTRATES BY CHEMICAL VAPOUR INFILTRATION WITH PREHEATED GAS

(75) Inventors: Eric Sion, Lyons (FR); Yvan Baudry, Hebron, KY (US); Bernard Delperier, Martignas (FR)

(73) Assignee: Messier-Bugatti, Velizy Villacoublay (FR)

( * ) Notice: Subject to any disclaimer, the term of this patent is extended or adjusted under 35 U.S.C. 154(b) by 6 days.

(21) Appl. No.: 10/034,848

(22) Filed: Dec. 26, 2001

(65) Prior Publication Data

US 2003/0118728 A1 Jun. 26, 2003

(51) Int. Cl.$^7$ .............................................. C23C 16/00
(52) U.S. Cl. .................................... 427/248.1; 427/900
(58) Field of Search ............................. 427/248.1, 900, 427/249.2

(56) References Cited

U.S. PATENT DOCUMENTS

| | | | |
|---|---|---|---|
| 4,094,897 A | 6/1978 | Nagasawa et al. | |
| 4,141,696 A | 2/1979 | Marion et al. | |
| 4,416,748 A | 11/1983 | Stevens | |
| 4,582,632 A | 4/1986 | Rokujo et al. | |
| 4,738,272 A | 4/1988 | McConnell | |
| 4,835,074 A | 5/1989 | Bolster et al. | |
| 4,920,017 A | 4/1990 | Herscovici | |
| 4,957,593 A | 9/1990 | Shaw et al. | |
| 5,225,378 A | 7/1993 | Ushikawa | |
| 5,348,774 A * | 9/1994 | Golecki et al. | 427/543 |
| 5,362,228 A * | 11/1994 | Vaudel | 432/120 |
| 5,480,678 A | 1/1996 | Rudolph et al. | |
| 5,496,410 A | 3/1996 | Fukuda et al. | |
| 5,567,267 A | 10/1996 | Kazama et al. | |
| 5,582,802 A | 12/1996 | Spokoyny et al. | |
| 5,652,030 A * | 7/1997 | Delperier et al. | 427/585 |
| 5,738,908 A * | 4/1998 | Rey et al. | 427/249.2 |
| 5,789,026 A * | 8/1998 | Delperier et al. | 427/249.2 |
| 5,803,959 A | 9/1998 | Johnson et al. | |
| 5,840,414 A | 11/1998 | Bett et al. | |
| 5,885,335 A | 3/1999 | Adams et al. | |
| 5,900,297 A * | 5/1999 | Rudolph et al. | 428/66.2 |
| 5,904,957 A * | 5/1999 | Christin et al. | 427/248.1 |
| 5,942,347 A | 8/1999 | Koncar et al. | |
| 6,001,419 A * | 12/1999 | Leluan et al. | 427/249.2 |
| 6,024,848 A | 2/2000 | Dufner et al. | |
| 6,051,071 A | 4/2000 | Charvet et al. | |
| 6,132,515 A | 10/2000 | Gauthier | |
| 6,144,802 A | 11/2000 | Kim | |
| 6,248,434 B1 | 6/2001 | Rödiger et al. | |
| 6,258,476 B1 | 7/2001 | Cipollini | |
| 6,336,965 B1 | 1/2002 | Johnson et al. | |
| 6,370,897 B1 | 4/2002 | Suenaga et al. | |
| 6,410,088 B1 * | 6/2002 | Robin-Brosse et al. | 427/249.2 |
| 6,572,371 B1 * | 6/2003 | Sion et al. | 432/247 |
| 6,645,287 B2 | 11/2003 | Nguyen et al. | |
| 2003/0042205 A1 | 3/2003 | Gaudet et al. | |
| 2003/0049372 A1 | 3/2003 | Cook et al. | |
| 2003/0091891 A1 | 5/2003 | Yoshida et al. | |
| 2003/0106495 A1 | 6/2003 | Asano et al. | |

FOREIGN PATENT DOCUMENTS

| | | |
|---|---|---|
| EP | 0 995 814 A2 | 4/2000 |
| JP | 62-20309 | 1/1987 |
| JP | 62249423 A | 10/1987 |
| JP | 06168877 A | 6/1994 |
| WO | WO 96/33295 | 10/1996 |
| WO | WO 98/17599 | 4/1998 |

* cited by examiner

Primary Examiner—Bret Chen
(74) Attorney, Agent, or Firm—Weingarten, Schurgin, Gagnebin & Lebovici LLP

(57) ABSTRACT

A method for densification of porous by CVI in which substrates are loaded into a loading zone of an oven and heated to a temperature at which a desired matrix material is formed from a precursor gas(es). A reative gas containing the precursor gas(es) is admitted into the end of the oven and heated upstream from the loading zone of the substrates. The reactive gas is also preheated prior to entering the oven so that, upon entering the oven, it is brought to an intermediate temperature between ambient temperature and the temperature to which the substrates are heated. In this manner, a very small temperature gradient is obtained throughout the loading zone.

13 Claims, 6 Drawing Sheets

METHOD FOR DENSIFYING POROUS SUBSTRATES BY CHEMICAL VAPOUR INFILTRATION WITH PREHEATED GAS

BACKGROUND OF THE INVENTION

The invention relates to densifying porous substrates by chemical vapour infiltration (CVI).

The field of application of the invention is that of making parts out of thermostructural composite material, i.e. out of a composite material that not only possesses mechanical properties that enable it to be used for making structural parts, but that also has the ability to conserve these properties at high temperatures. Typical examples of thermostructural composite materials are carbon/carbon (C/C) composites having a reinforcing fabric of carbon fibers densified by a pyrolytic carbon matrix, and ceramic matrix composites (CMCs) having a reinforcing fabric of refractory fibers (carbon or ceramic) densified by a ceramic matrix.

A well known process for densifying porous substrates, to make C/C composite or CNC parts is chemical vapour infiltration. The substrates to be densified are placed in a loading zone of an oven in which they are heated. A reactive gas containing one or more gaseous precursors of the material that is to constitute the matrix is introduce into the oven. The temperature and pressure inside the oven are adjusted to enable the reactive gas to diffuse within the pores of the substrates and deposit matrix-constituting material therein by one or more components of the reactive gas decomposing or reacting together, said components constituting the matrix precursor. The process is performed under low pressure in order to encourage the reactive gas to diffuse into the substrates. The transformation temperature of the precursor(s) to form the matrix material, such as pyrolytic carbon or ceramic, is usually greater than 900° C., and is typically close to 1000° C.

In order to enable substrates throughout the loading zone of the oven to be densified as uniformly as possible, whether in terms of increasing density or in terms of the microstructure of the matrix material that is formed, it is necessary for the temperature throughout the loading zone to be substantially uniform.

Such ovens usually also include a zone situated between the reactive gas inlet into the oven and the loading zone of the oven in which the reactive gas is heated. Typically the gas heating zone comprises a plurality of perforated plates through which the reactive gas passes.

The gas-heating plates, like the substrates, are heated because they are present in the oven. The oven is generally heated by means of a susceptor, e.g. made of graphite, which defines the side wall of the oven and which is inductively coupled to an induction coil surrounding the oven, or is heated by resistors surrounding the susceptor.

The Applicants have found that the presence of a zone for heating the reactive gas does not always give the desired result. A significant example is that of densifying substrates constituted by annular preforms of carbon fibers or pre-densified annular blanks for use in making C/C composite brake disks. The substrates are placed in one or more vertical stacks in the loading zone above the gas heating zone which is situated at the bottom of the oven. In spite of the reactive gas being heated, a temperature gradient is observed between the bottom of the loading zone and the remainder thereof, with the temperature close to substrates situated at the bottom of the stack possibly being several tens of ° C. lower than the temperature that applies in the remainder of the stack. This gives rise to a large densification gradient between the substrates, depending on the position of a substrate within the stack.

In order to solve that problem, it would be possible to increase the efficiency with which the reactive gas is heated by increasing the heating zone. Nevertheless, for given total volume of the oven, that would reduce the working volume available in the loading zone. Unfortunately, chemical vapour infiltration processes require large amounts of industrial investment and they are very lengthy to perform. It is therefore highly desirable for ovens to have high productivity, whether they be ovens already in service or new ovens yet to be built, and thus as high as possible a ratio of working volume dedicated to the load of substrates over the volume which is dedicated to heating the reactive gas.

OBJECT AND SUMMARY OF THE INVENTION

The object of the invention is to propose a method of densification by chemical vapour infiltration which makes it possible to obtain a temperature gradient which is very small throughout the loading zone, but without requiring a large volume for the zone that heats the reactive gas, and thus without deteriorating, and possibly even improving the productivity of such ovens.

This object is achieved by a method of the type comprising the steps of:

loading substrates for densification in a loading zone of an oven;

heating the substrates in the oven so as to raise them to a temperature at which the desired matrix material is formed from the precursor gas(es) contained in the reactive gas;

admitting the reactive gas to one end of the oven; and heating the reactive gas after it has entered into the oven by passing it through a gas heating zone situated upstream from the loading zone in the flow direction of the reactive gas in the oven;

in which method, according to the invention:

the reactive gas is preheated prior to entering into the oven so that on entering into the oven it is brought to an intermediate temperature between ambient temperature and the temperature to which the substrates are heated.

Preheating the reactive gas outside the loading zone enables the heating zone situated within the oven to be more effective in bringing the reactive gas to the desired temperature as soon as it penetrates into the substrate loading zone.

When infiltration is performed at a temperature greater than 900° C., the reactive gas is preheated prior to entering into the oven so that on entering the oven it is at a temperature which is preferably not less than 200° C. Nevertheless, it is preferable for the temperature to which the gas is preheated not to exceed 900° C., or even 600° C., in order to avoid any unwanted deposits due to the precursor(s) being transformed prior to penetrating into the oven, and in order to make it possible to use relatively ordinary materials for the pipework feeding the oven with preheated reactive gas and for components such as valves and gaskets mounted in said pipework.

Preheating can be performed at a gas pressure that is substantially equal to the pressure that exists inside the oven, or else at a higher pressure. When performed at a higher pressure, the preheated reactive gas is expanded before entering the oven.

The invention also seeks to provide an installation enabling the method to be implemented.

This object is achieved by means of an installation of the type comprising:

an oven, a zone for loading substrates into the oven, means for heating substrates in the loading zone, at least one inlet for admitting reactive gas into the oven, and at least one gas heating zone situated in the oven between the reactive gas inlet and the loading zone, in which installation, according to the invention, there is also provided at least one gas preheating device situated outside the oven and connected to at least one reactive gas inlet to the oven, so as to preheat the reactive gas before it enters the oven.

In an embodiment of the invention, the preheating device comprises an electrical heater tube inserted in a duct for feeding reactive gas to the reactive gas inlet of the oven.

In other embodiments of the invention, the preheater device comprises a gas boiler or an electric oven having at least one duct or bundle of tubes passing therethrough for conveying the reactive gas to be preheated.

BRIEF DESCRIPTION OF THE DRAWINGS

Other features and advantages of the method of the invention and of installations of the invention will appear on reading the following description given by way of non-limiting indication and with reference to the accompanying drawings, in which.

DETAILED DESCRIPTION OF EMBODIMENTS

Implementations of the method and embodiments of the installation of the invention are described below in the context of an application to densifying annular porous substrates. The latter may constitute carbon fiber preforms or pre-densified blanks for making brake disks out of C/C composite material, the pre-densified blanks being obtained by pre-densification of performs by chemical vapour infiltration or by liquid (resin) impregnation followed by carbonization. Such brake disks are commonly used for aircraft landing gears and for racing cars.

Figure 1:
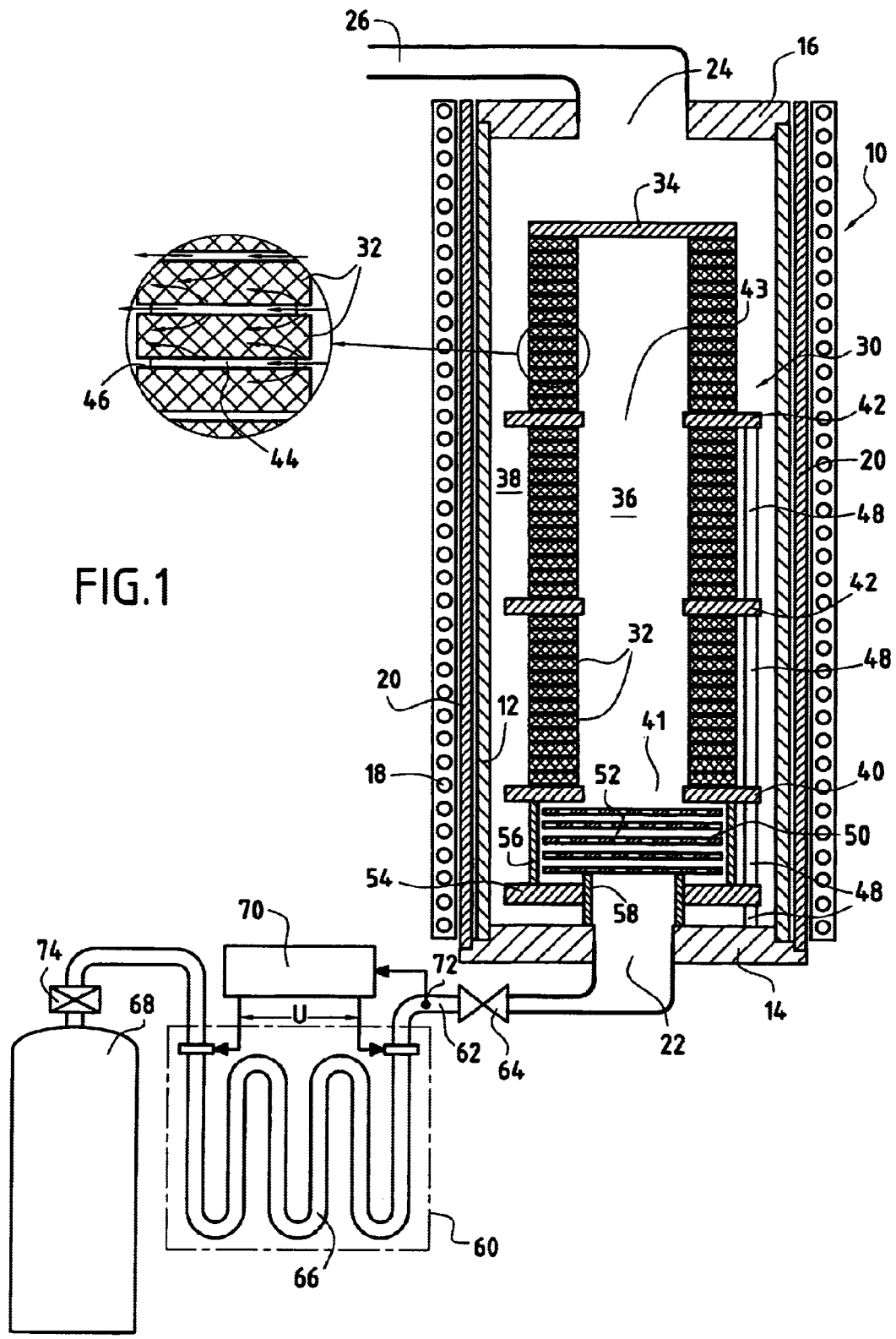
FIG. 1 is a highly diagrammatic section view of a first embodiment of a densifying installation of the invention.

FIG. 1 is a diagram showing an oven 10 defined by a cylindrical side wall 12, a bottom wall 14, and a top wall 16. The wall 12 constitutes a secondary transformer circuit or susceptor, e.g. being made out of graphite, and it is coupled with a primary transformer circuit or induction coil 18 situated outside the oven, with insulation 20 interposed between them. The oven is heated by the susceptor 12 when electricity is fed to the induction coil 18.

The reactive gas is introduced into the oven via a passage 22 formed through the bottom wall 14, and the effluent gas is extracted via a passage 24 formed through the top wall 16, the passage 24 being connected by a pipe 26 to suction means such as a vacuum pump (not shown).

Substrates 32 to be densified are placed so as to form an annular vertical stack which is closed at the top by a cover 34. The stacked substrates thus subdivide the inside volume of the loading zone 30 into a volume 36 inside the stack constituted by the aligned central passages of the substrates, and a volume 38 outside the stack.

The stack of substrates stands on a bottom support plate 40, and it can be subdivided into a plurality of superposed sections that are separated by one or more intermediate plates 42, the plates 40, 42 having central passages 41, 43 in alignment with the passages of the substrates 32. Although only one stack is shown in FIG. 1, a plurality of stacks could be placed side by side in the oven 10, as described below.

As shown by the detail in FIG. 1, each substrate 32 is spaced apart from an adjacent substrate, or where appropriate a plate 40, 42 or the cover 34, by spacers 44 which leave gaps 46. The spacers 44, or at least a fraction of them, are arranged to leave passages for the gas between the volumes 36 and 38 via the gaps 46. These passages can be provided in such a manner as to ensure pressures in the volumes 36 and 38 are in equilibrium, as described in U.S. Pat. No. 5,904,957, or in such a manner as to constitute simple leakage passages for maintaining a pressure gradient between the volumes 36 and 38, as described in the French patent application filed under the No. 01/03004.

A gas heating zone 50 extends between the bottom 14 of the oven and the bottom support plate 40. In conventional manner, the heating zone 50 comprises a plurality of perforated plates 52, e.g. made of graphite, C/C composite or CMC, placed one above the other, and spaced apart from one another. The plates 52 can be received in a housing having a bottom 54 and a side wall 56, and defining the heating zone. A pipe 58 connects the reactive gas inlet 22 to the heating zone 30 through the bottom 54.

Underframes and legs 48 support the gas-heating housing and the plates 40, 42. All of these elements are made out of graphite, for example.

The reactive gas admitted into the oven via the inlet 22 passes through the heating zone 50 and penetrates into the volume 36 through the central orifice 41 of the plate 40. The reactive gas flows from the volume 36 towards the volume 38 by passing through the pores of the substrates 32 and through the passages provided in the gaps 46. The effluent gas is extracted from the volume 38 via the outlet 24.

In a variant embodiment, the volume 36 can be closed at the bottom and put into communication with the outlet 24 at the top. The reactive gas coming from the heating zone 30 is then admitted into the volume 38 of the loading zone and gas flows through said zone from the volume 38 towards the volume 36, the volume 38 then being closed at the top.

In yet another variant, the reactive gas inlet can be provided through the top wall 16 of the oven, in which case the heating zone is situated in the top portion of the oven. That one of the two volumes 36 and 38 which is communication with the heating zone is closed at its bottom end, while the other one of said two volumes communicates with a gas outlet formed through the bottom wall of the oven.

To form a matrix of pyrolytic carbon, the reactive gas contains one or more precursors of carbon, such as hydrocarbons. Commonly used precursors are methane, propane, or a mixture thereof. Chemical vapour infiltration is performed at a temperature which is generally greater than 900° C., for example in the range 950° C. to 1100° C., and at low pressure, for example at a pressure of less than 0.1 kilopascals (kPa).

In accordance with the invention, the reactive gas is preheated prior to being admitted into the oven by passing through a preheater device 60 connected by a feed pipe 62 to the inlet 22 of the oven. The pipe 62 is preferably thermally insulated. An isolating valve 64 is installed on the pipe 62 immediately upstream from the inlet 22 to the oven so as to make it possible, where appropriate, to isolate the oven from the reactive gas feed circuit.

In the embodiment of FIG. 1, the preheater device comprises an electrical heater tube 66 which conveys the reactive gas coming from a source 68 and which is connected to the pipe 62.

Electrical heater tubes are known devices for heating flowing fluids. Heat is produced by the Joule effect by allowing an electrical current to flow through a section of the tube. The tube constitutes simultaneously an electrical resistance element, a fluid flow duct, and a heat exchange surface.

The electrical current is produced by an electrical power supply circuit 70 delivering a voltage U and connected to the ends of the tube section. Circuit 70 receives information delivered by a sensor 72, e.g. a thermocouple, placed at the outlet from the preheater device. The preheating temperature is regulated to a predetermined value by automatically adjusting the voltage U as a function of the temperature measured by the sensor 72.

The reactive gas can be heated under the low pressure that exists inside the oven, with an expander 74 being located at the outlet from the gas source 68.

In a variant, the reactive gas can be heated under pressure that is greater than that which exists inside the oven, i.e. at a pressure that is intermediate between the pressure in the source 68 and the pressure in the oven. Under such circumstances, the preheated reactive gas is expanded prior to entering into the oven, e.g. by passing through a calibrated orifice fitted in the feed pipe 62.

The purpose of preheating the reactive gas is to ensure that after the gas has been further heated by passing through the heating zone 50, it penetrates into the loading zone at a temperature that is equal or close to the temperature necessary for avoiding a significant temperature gradient between the bottom of the loading zone and the remainder thereof.

In order to be effective, the reactive gas should preferably be preheated so that the gas delivered to the inlet of the oven is at a temperature of at least 200° C.

The preheating temperature, i.e. the temperature at the outlet from the preheating device, must nevertheless be limited in order to avoid the risk of forming unwanted deposits (soot) in the feed pipe 62, and also because of constraints of a technological nature.

Thus, the preheating temperature is selected to be no greater than 800° C. in order to avoid unwanted deposits, and preferably no greater than 600° C. so as to make it possible to use materials of affordable cost for the pipe 62 (e.g. steel) and for the isolating valve 64 and for any other components that are exposed to the preheated gas, such as sealing gaskets.

Depending on the length of the pipe 62 and how well it is heat-insulated, the temperature of the preheated gas can drop to a greater or lesser extent after leaving the preheating device and before entering the oven. Thus, with preheating to 600° C., the temperature of the gas can lose a few degrees to a few tens of degrees before penetrating into the oven, or possibly a little upstream therefrom due to the influence of the atmosphere inside the oven.

Figure 2:
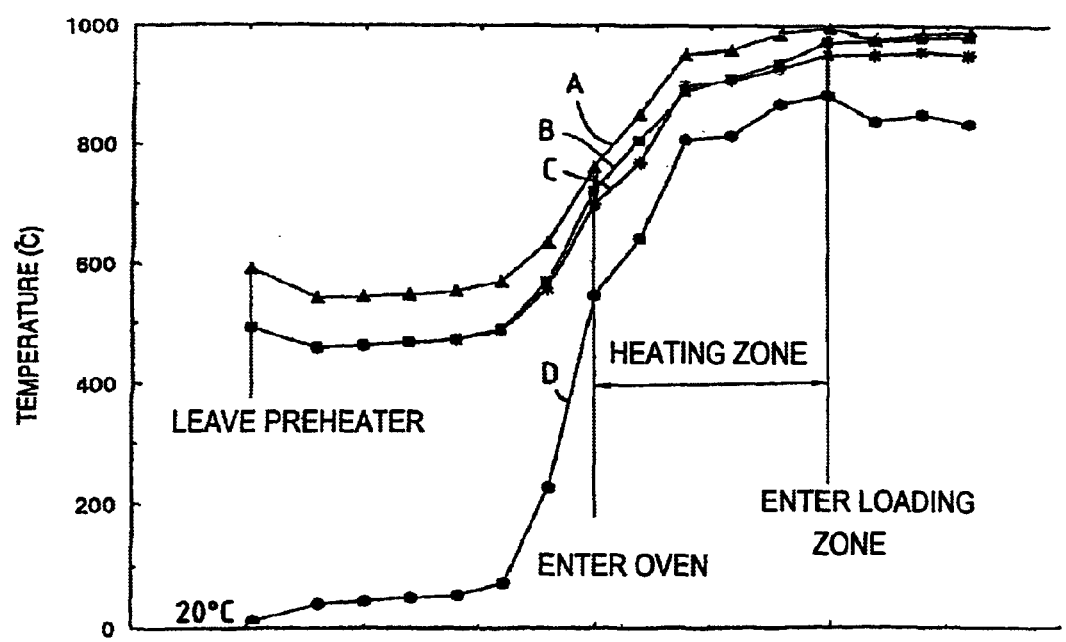
FIG. 2 is a graph showing curves that illustrate how the temperature of the reactive gas varies from prior to entering the oven to immediately after entering the substrate loading zone, both with preheating of the reactive gas and without preheating of the reactive gas.

Tests have been performed feeding an oven similar to that shown in FIG. 1 with a reactive gas preheated to 600° C. The temperature of the gas was measured at the outlet from the preheating device, along the feed pipe, at the inlet into the oven, and at the outlet from the heating zone 50 situated inside the oven. Curve A in FIG. 2 shows the observed variation in temperature.

Other tests have been performed with preheating to a temperature of 500° C., respectively with the reactive gas flowing at the same rate and with the gas flowing at a rate increased by about 42%. Curves B and C in FIG. 2 show the measured temperature variations.

By way of comparison, tests were performed without preheating, the reactive gas being admitted into the pipe 62 at a temperature of 20° C. and at the same flow rate as for preheating at 600° C. Curve D in FIG. 2 shows the measured variation in the temperature of the reactive gas until it penetrated into the oven loading zone.

For a given flow rate of reactive gas, and using the same heating zone, preheating the gas to 600° C. and to 500° C. (curves A and B) make it possible to raise the gas to temperatures of about 993° C. and 975° C. on entry into the loading zone, whereas without preheating (curve D), said temperature was considerably lower at 850° C.

Thus preheating the gas serves to avoid a temperature gradient liable to give rise to a significant gradient in densification between substrates situated at the bottom of the stack and the other substrates.

The Applicants estimate that increasing the efficiency of the heating zone 50 so as to make it possible without gas preheating to achieve a result similar to that obtained with gas preheating would require at least 5% of the loading volume to be taken for that purpose. Preheating the reactive gas outside the oven thus makes it possible to improve oven productivity significantly.

In addition, preheating to 500° C. conserves its effectiveness with a significantly increased flow rate since the temperature at the inlet to the loading zone was about 950° C. (curve C). Preheating thus makes it possible to increase the flow rate of the reactive gas, which is favorable to decreasing the total duration of the densification process.

Figure 3:
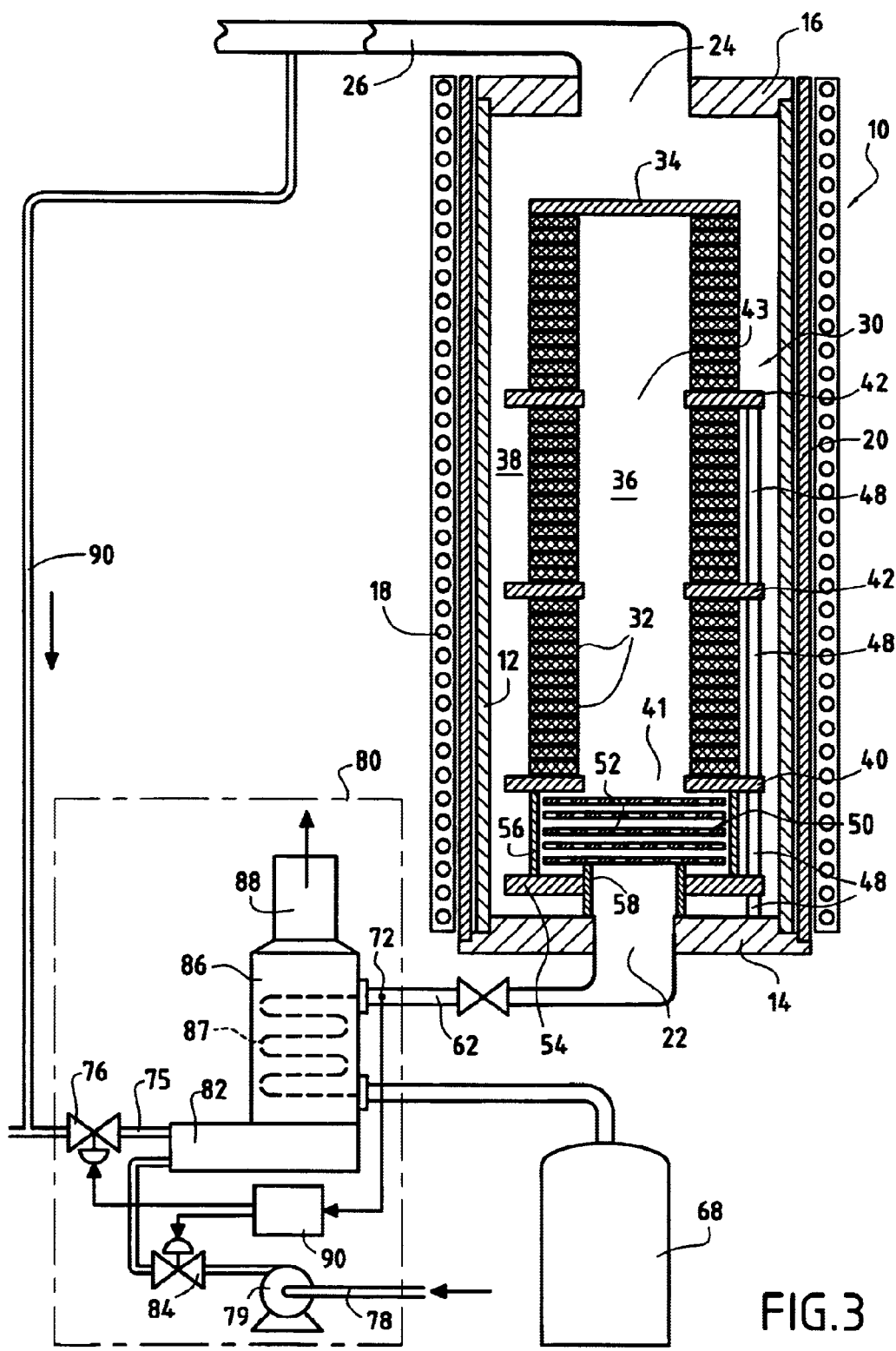
FIG. 3 is a highly diagrammatic section view of a second embodiment of a densifying installation of the invention.

FIG. 3 shows a variant embodiment of the densification installation which differs from that of FIG. 1 in that the preheating device 80 is not formed by an electrical heater tube, but by a gas boiler.

The boiler 80 has a burner 82 fed with fuel gas, e.g. a gaseous hydrocarbon such as natural gas, via a pipe 75 having a regulator valve 76 mounted thereon. The burner 82 is fed with dilution air via a pipe 78 having a compressor 79 and a regulator valve 84 mounted thereon. The resulting combustion gases pass through a heat exchanger 86 prior to being evacuated via a chimney 88. The reactive gas coming from the source 68 flows through the heat exchanger 86 via a duct 87 prior to being admitted into the oven via the feed pipe 62.

The regulator valves 76 and 84 are controlled by a regulator circuit 90 as a function of a signal supplied by a temperature sensor 72 at the outlet from the boiler 80 so as to set the temperature to which the reactive gas is preheated to the desired value.

A fraction of the effluent gas can be taken from the pipe 26 for mixing with the fuel gas which feeds the burner of the boiler.

Naturally, other types of fluid heater device could be used for preheating the reactive gas.

Thus, the reactive gas could be preheated by flowing along a tube or a bundle of tubes in an oven that is heated by electrical resistance elements, with the temperature of the reactive gas at the outlet from the heater device being regulated by controlling the power supplied to the electrical resistance elements.

Figure 4:
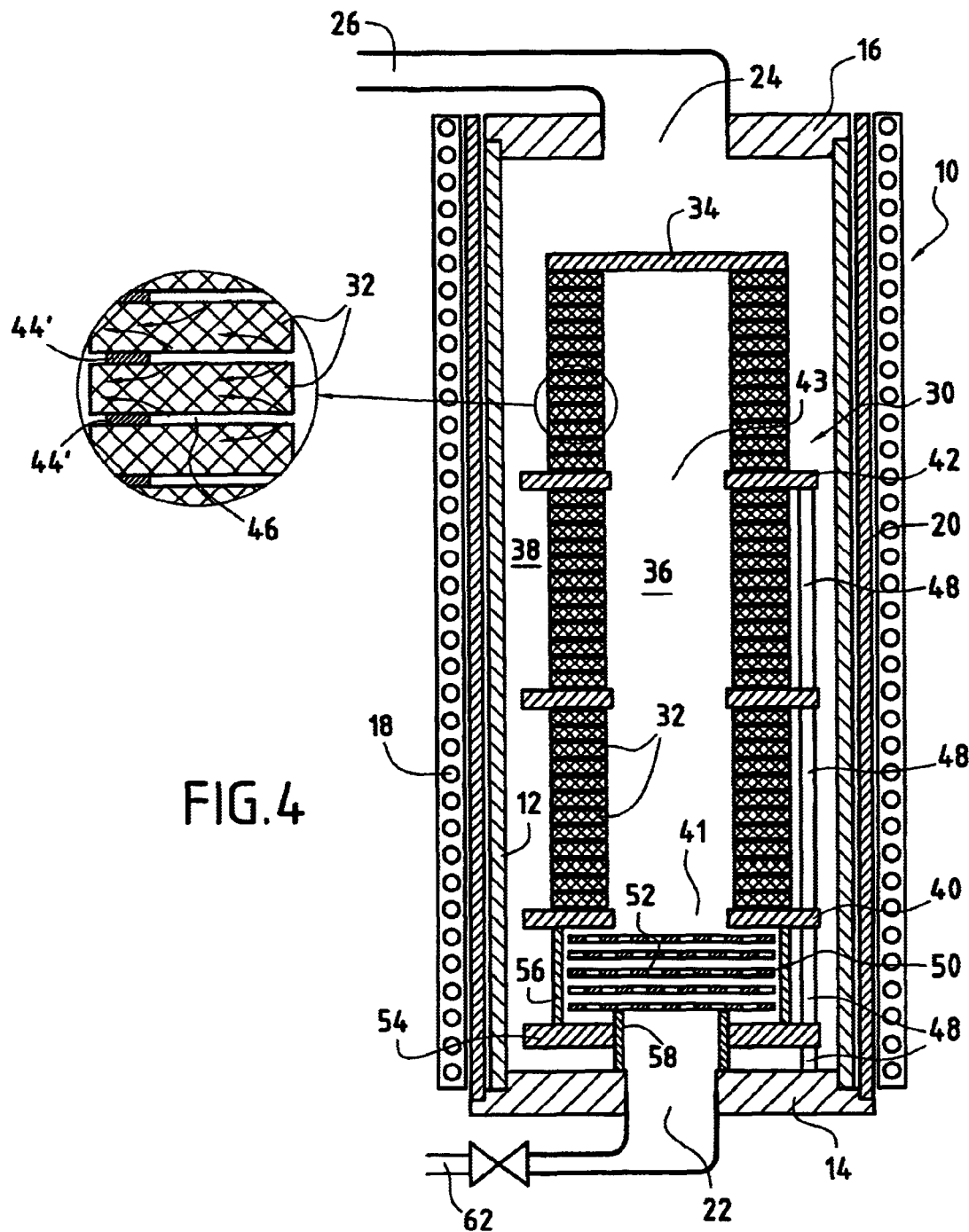
FIG. 4 shows another way of loading substrates in a densifying installation.

FIG. 4 shows a variant technique for loading the substrates 32. As shown in the detail of FIG. 4, the gaps 46 between adjacent substrates or between a substrate and a plate 40, 42 or cover 34 are provided with annular spacers which close off the gaps 46 in leaktight manner. As a result, the reactive gas can pass from the volume 36 into the volume 38 solely by passing through the pores in the substrates, thereby giving rise to a quite significant pressure gradient between these two volumes.

Figures 5, 6:
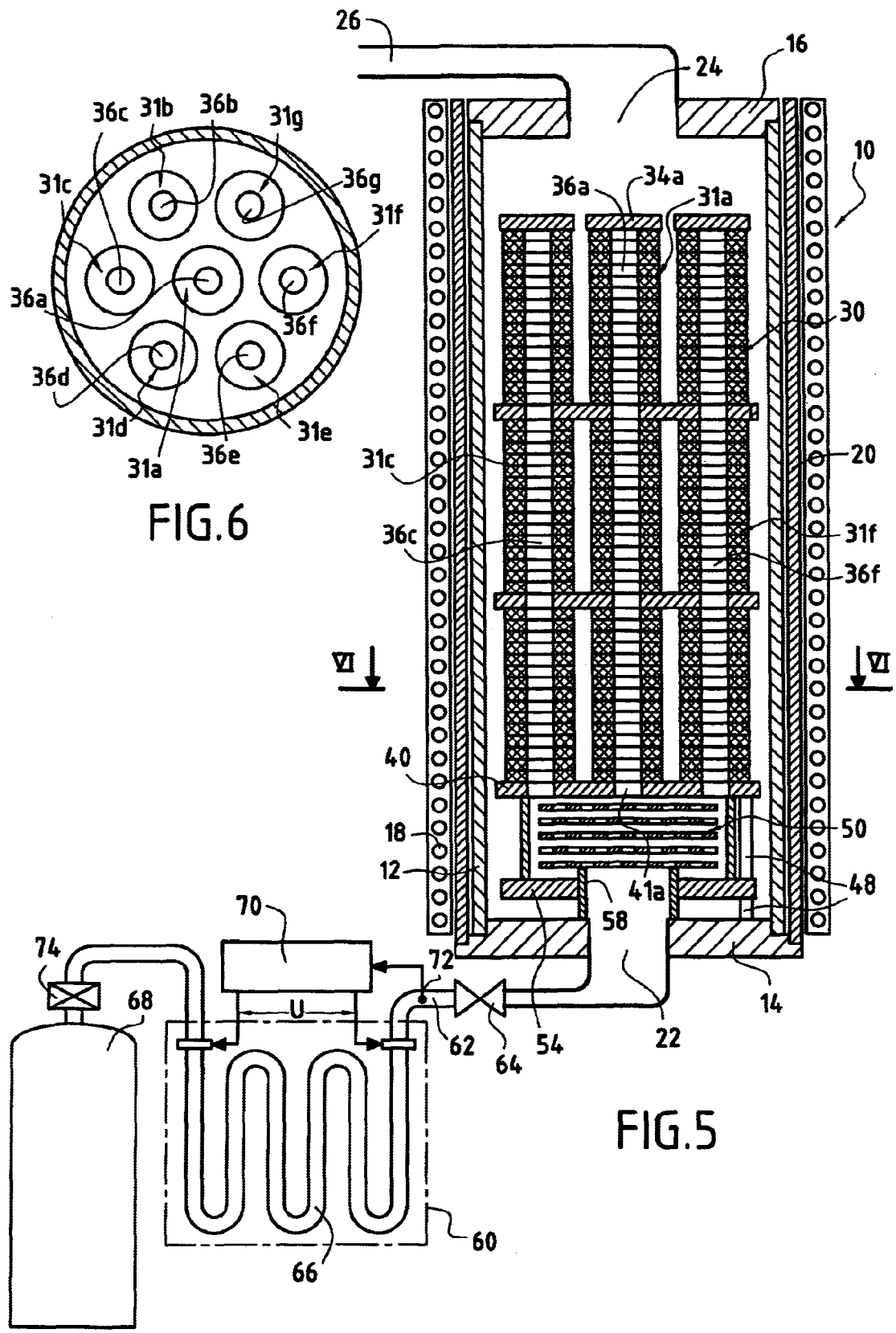
FIG. 5 is a diagram showing yet another way of loading substrates in an oven in the form of a plurality of annular stacks.
FIG. 6 is a highly diagrammatic section view on plane VI—VI of FIG. 5.

FIGS. 5 and 6 show a variant loading configuration for the substrates which differs from the loading shown in FIG. 1 in that the substrates 32 are disposed as a plurality of annular stacks 31a, 31b, 31c, 31d, 31e, 31f, and 31g all standing on the support plate 40. The support plate has a plurality of passages such as 41a in alignment with the inside volumes 36a to 36g of the stacks, and each stack is closed on top by a cover such as 34a. The reactive gas flows through the heating zone 50 and then the inside volumes of the stacks from which the gas passes into the volume 38 outside the stacks inside the loading zone 30. Although seven stacks are shown in FIG. 6, the number of stacks could naturally be different, and in particular it could be greater than seven.

Figure 7:
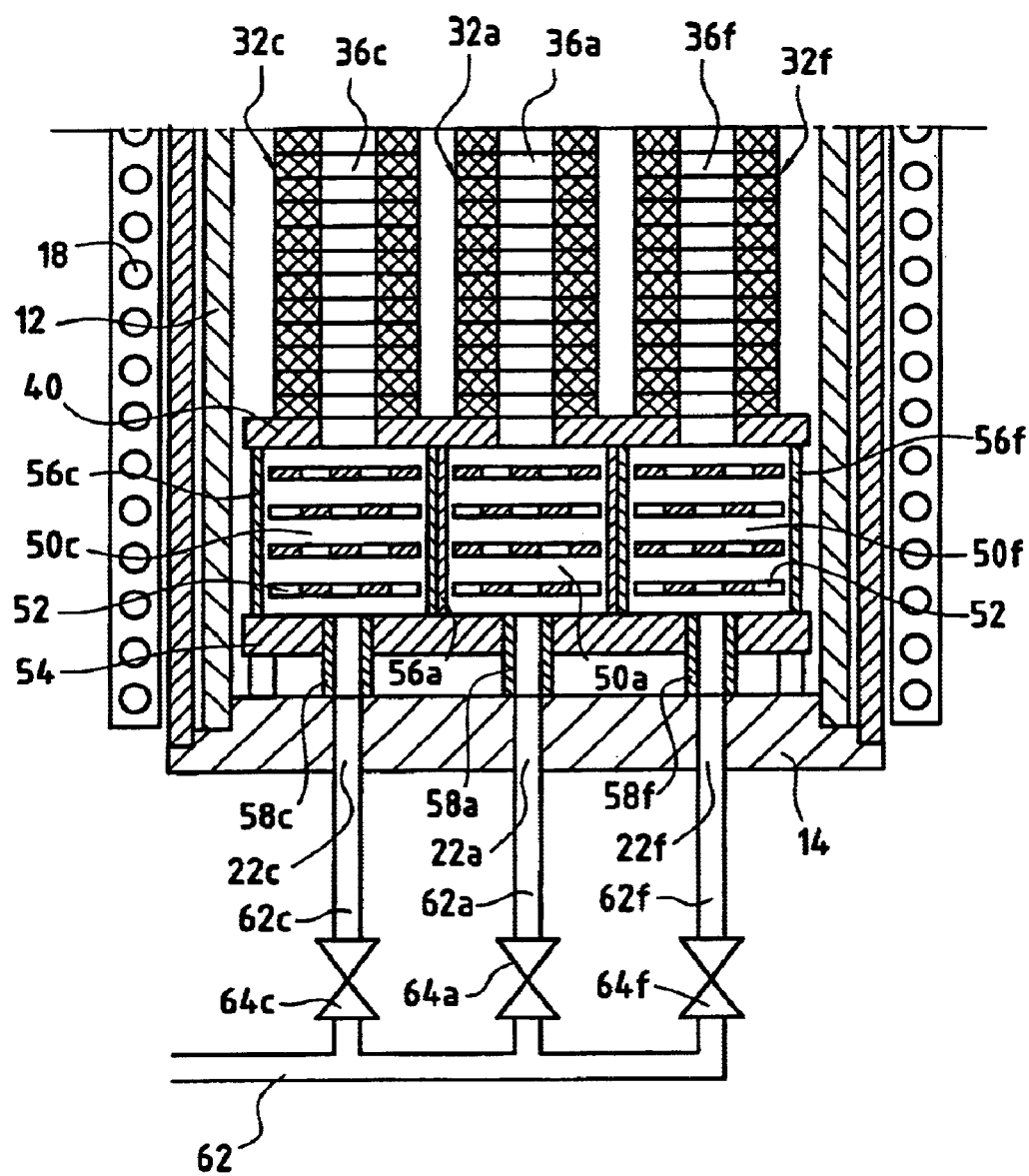
FIG. 7 is a fragmentary view of a densifying installation showing a variant implementation of the reactive gas feed of the oven, in which the load in the oven is formed by a plurality of stacks of substrates.

FIG. 7 shows another way of feeding an oven with reactive gas when the load is in the form of a plurality of annular stacks. This embodiment differs from that of FIG. 5 in that the stacks are fed individually with reactive gas.

Thus, a plurality of passages are formed through the bottom 14 of the oven substantially in alignment with the inside volumes of the stacks. In FIG. 7, only three passages 22a, 22c, and 22f can be seen, in alignment with the inside volumes 36a, 36c, and 36f of the stacks 32a, 32c, and 32f. Individual reactive gas feed pipes such as 62a, 62c, and 62f are connected to passages formed in the bottom of the oven.

The stacks supported by the plate 40 surmount individual heating zones such as 50a, 50c, and 50f. The heating zones are defined by respective vertical cylindrical walls 56a, 56c, and 56f, a common bottom 54, and the plate 40. Pipes such as 58a, 58c, and 58f connect the openings formed through the bottom of the oven to the various heating zones via respective orifices formed in the bottom 54 of the heater housing. Each heater zone comprises a plurality of perforated plates 52 placed one above another.

Valves such as 64a, 64c, and 64f are fitted in the individual feed pipes.

In the installation shown, reactive gas coming from the preheater device (not shown in FIG. 7) flows along a common pipe 62 to which the individual pipes such as 62a, 62c, and 62f are connected. The stacks are then fed with reactive gas that has been preheated to a common temperature.

In a variant, in order to accommodate possible temperature differences within the heating zones and at the bottoms of the stacks, depending on the locations of the stacks within the oven, the individual pipes such as 62a, 62c, and 62f can be connected to respective preheater devices. This makes it possible for the preheating temperature of the reactive gas to be adjusted individually as a function of the position within the oven of the particular stack of substrates to which the reactive gas is delivered.

Finally, it should be observed that the field of application of the invention is not limited in any way to making C/C composite brake disks, but also extends to making other parts out of C/C composite material, for example the diverging portions of rocket engine nozzles, as shown in particular in U.S. Pat. No. 5,904,957 cited above. More generally, the invention can be implemented for making parts out of any type of thermostructural composite material, i.e. not only out of C/C composite materials, but also out of CMCs. With CMCs, the reactive gas is selected as a function of the particular nature of the ceramic matrix. Gaseous precursors for ceramic matrices are well known, for example methyltricholosilane (MTS) and hydrogen gas ($H_2$) to form a matrix of silicon carbide. Reference can be made to French patent No. 2 401 888 which describes methods of forming various kinds of ceramic.

What is claimed is:

1. A method of densifying porous substrates with a matrix obtained by chemical vapour infiltration using a reactive gas containing at least one gaseous precursor for the matrix material, the method comprising the steps of:

loading substrates for densification in a loading zone of an oven;

heating the substrates in the oven so as to raise them to a temperature at which the desired matrix material is formed from the precursor gas(es) contained in the reactive gas;

admitting the reactive gas to one end of the oven; and heating the reactive gas after it has entered into the oven by passing it through a gas heating zone situated upstream from the loading zone in the flow direction of the reactive gas in the oven;

wherein the reactive gas is preheated prior to entering into the oven so that on entering into the oven it is brought to an intermediate temperature between ambient temperature and the temperature to which the substrates are heated.

2. A method according to claim 1, wherein the substrates are raised to a temperature greater than 900° C. and the reactive gas is preheated, prior to entering the oven, so as to be raised to a temperature of not less than about 200° C. on entering into the oven.

3. A method according to claim 2, wherein the reactive gas is preheated to a temperature, no greater than 900° C. prior to entering the oven.

4. A method according to claim 2, wherein the reactive gas is preheated to a temperature no greater than 600° C. prior to entering the oven.

5. A method according to claim 1, wherein the reactive gas is preheated outside the oven by passing through a heat exchanger.

6. A method according to claim 1, wherein the reactive gas is preheated outside the oven at a pressure which is substantially equal to the pressure that exists inside the oven.

7. A method according to claim 1, wherein the reactive gas is preheated outside the oven at a pressure which is higher than that which exists in the oven, and is expanded prior to entering into the oven.

8. A method according to claim 1, for densifying porous annular substrates for brake disks made of carbon/carbon composite material.

9. A method according to claim 8, wherein the substrates are loaded into the oven in one or more annular stacks and the reactive gas from the gas heating zone is channeled into one of the two volumes constituted by the volume(s) inside the annular stack(s) and by the volume of the loading zone outside the annular stack(s), and an effluent gas is taken from the other one of the two volumes to be evacuated from the oven.

10. A method according to claim 9, wherein the substrates are stacked so as to leave leakage passages between them, putting said two volumes into communication with each other.

11. A method according to claim 9, wherein the substrates are stacked without leaving leakage passages between them, so that the reactive gas can pass from one of said two volumes to the other solely by passing through the pores of the substrates.

12. A method according to claim 9, wherein the annular stacks are individually fed with reactive gas via respective passages through a wall of the oven.

13. A method according to claim 12, wherein the preheating temperature of the reactive gas feeding the stacks of substrates is adjusted individually for each stack.

* * * * *

UNITED STATES PATENT AND TRADEMARK OFFICE
CERTIFICATE OF CORRECTION

PATENT NO. : 6,953,605 B2  
APPLICATION NO. : 10/034848  
DATED : October 11, 2005  
INVENTOR(S) : Eric Sion et al.

Page 1 of 1

It is certified that error appears in the above-identified patent and that said Letters Patent is hereby corrected as shown below:

Title Page, Abstract (57), line 1, "porous by" should read --porous substrates by--;

Title Page, Abstract (57), line 4, "reative" should read --reactive--;

Title Page, Abstract (57), line 5, "into the end" should read --into one end--.

Signed and Sealed this

First Day of August, 2006

JON W. DUDAS  
*Director of the United States Patent and Trademark Office*